United States Patent [19]

Coash

[11] Patent Number: 4,684,853

[45] Date of Patent: Aug. 4, 1987

[54] GARAGE DOOR OPENER USING TRANSMITTER WITH SAW OSCILLATOR MODULATOR

[75] Inventor: Ronald J. Coash, Lincoln, Nebr.

[73] Assignee: Emhart Industries, Inc., Indianapolis, Ind.

[21] Appl. No.: 889,589

[22] Filed: Jul. 25, 1986

Related U.S. Application Data

[63] Continuation of Ser. No. 765,279, Aug. 13, 1985, abandoned.

[51] Int. Cl.⁴ .............................................. H04Q 7/02
[52] U.S. Cl. .................................... 318/16; 318/560; 49/25
[58] Field of Search ................. 318/16, 460, 669, 560; 49/25; 331/107 A; 367/197, 199; 334/8, 9, 10

[56] References Cited

U.S. PATENT DOCUMENTS

| | | | |
|---|---|---|---|
| 3,742,434 | 6/1973 | Leyde et al. | 49/25 X |
| 3,855,548 | 12/1974 | Nandi et al. | 331/107 A |
| 3,979,697 | 9/1976 | Donahue | 331/107 A |
| 4,009,476 | 2/1977 | Lutz | 49/25 X |
| 4,271,504 | 6/1981 | Brossard et al. | 332/26 X |
| 4,560,951 | 12/1985 | Fütterer | 331/107 A |
| 4,581,592 | 4/1986 | Bennett | 331/107 A |

OTHER PUBLICATIONS

Precision L-Band SAW Oscillator for Satellite Application, Thomas O'Shea et al., Sawtek, Inc. 6-16-83.

Primary Examiner—William M. Shoop, Jr.
Assistant Examiner—Bentsu Ro
Attorney, Agent, or Firm—Robert F. Meyer; Carl A. Forest

[57] ABSTRACT

A radio frequency (r-f) transmitter has an electric oscillator circuit for producing an oscillating r-f signal in an antenna. A feedback sub-circuit of the oscillator circuit includes a surface acoustic wave (SAW) resonator for stabilizing the oscillations. The feedback circuit has a Q of less than 12000. There is a modulation sub-circuit of the oscillator circuit which includes a voltage variable capacitor. The voltage variable capacitor responds to input voltage variations to modulate the capacitance of the feedback circuit, thereby modulating the frequency of the transmitter. A garage door opener system employing the transmitter is also disclosed.

9 Claims, 4 Drawing Figures

GARAGE DOOR OPENER USING TRANSMITTER WITH SAW OSCILLATOR MODULATOR

This application is a continuation of application Ser. No. 06/765,279, filed Aug. 13, 1985, now abandoned.

BACKGROUND OF THE INVENTION

1. Field of the Invention. The invention, in general, relates to radio frequency (r-f) transmitters, and more particularly to a frequency modulated transmitter in which the frequency is stabilized by a surface acoustic wave (SAW) device.

2. Description of the Prior Art. Frequency modulated (FM) transmitters are well known in the radio art. Recently, surface acoustic wave resonators (SAWR) have been used in r-f receivers and in amplitude modulated transmitters. See, for example, Precision L-Band Saw Oscillator for Satellite Application, by Thomas O'Shea et al which is available from Sawtek Inc., Post Office Box 1800, Orlando, Fla. 32860. Such SAW devices are very useful in high frequency applications because above about 50 megahertz the bulk crystal oscillators of the prior art must be so small that they easily break, and the frequency multipliers of the prior art consume relatively large amounts of power, especially when used in the ultra high frequency range.

Up to the time of the present invention it was thought it was not possible to make a workable FM modulated SAW transmitter. It was thought that a SAW device could not be made stable at the frequency shifts necessary in FM transmitters, and further that the SAW device would also be unstable i.e., become free running, at the power levels required to produce a useable transmission range (over 100 feet) at high frequencies (50 megahertz-1 gigahertz). Moreover, it was believed that it was not possible to modulate the SAW to the extent necessary that the signal could be received by wide band receivers and/or that a SAW transmitter with acceptable manufacturing tolerances would not be economical.

SUMMARY OF THE INVENTION

It is an object of the invention to provide an FM SAW transmitter.

It is a further object of the invention to produce an FM SAW transmitter that is stable under frequency modulations normal in FM transmitters and that is relatively economical to manufacture.

It is another object of the invention to provide a high frequency transmitter that overcomes one or more of the disadvantages of prior art high frequency transmitters.

It is yet another object of the invention to provide an FM SAW transmitter that has a very useful transmission range.

The invention provides a transmitter circuit comprising an electric oscillator circuit for producing an oscillating r-f signal, said oscillator circuit including a SAW oscillator for stabilizing the oscillations, and a means for modulating the oscillation frequency of the oscillator circuit. Preferably, the oscillator circuit includes a feedback circuit and the SAW device is a SAW resonator electrically connected within the feedback circuit to stabilize the oscillations. Preferably, the Q of the feedback circuit is less than 12,000. Preferably, the means for modulating comprises a voltage variable capacitor for modulating the capacitance of the oscillator circuit.

The invention also provides a garage door opener system comprising a means for mechanically connecting to a garage door, a motor for driving the means for mechanically connecting, a manually operable switch means, a means responsive to the switch for producing a transmitter input signal, a transmitter as described above responsive to the transmitter input signal for producing an r-f signal, a means for receiving the r-f signal and for producing a controller input signal, and a controller means responsive to the controller input signal for providing power to the motor.

The transmitter circuit of the invention not only provides the advantages and objects discussed above but also is embodied on a single integrated circuit chip, something that was not thought possible before the present invention. Numerous other features, objects and advantages of the invention will become apparent from the following detailed description when read in conjunction with the accompanying drawings.

DESCRIPTION OF THE PREFERRED EMBODIMENT

Figure 1:
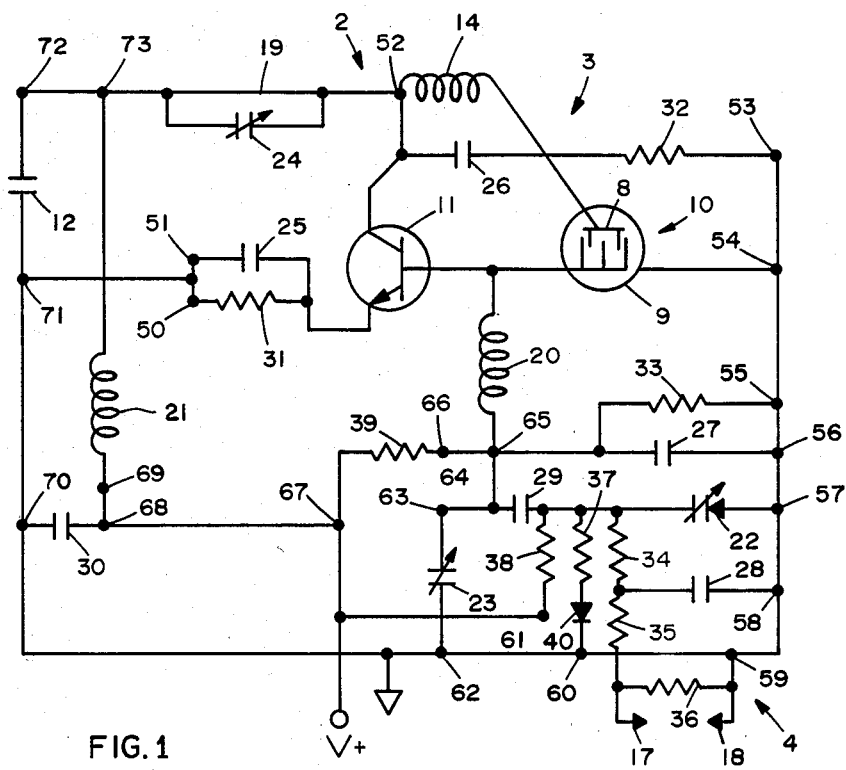
FIG. 1 is a detailed electrical circuit diagram of the preferred embodiment of a transmitter according to the invention.

Directing attention to FIG. 1, an electrical circuit diagram of a transmitter according to the invention is shown. For ease of discussion, it is useful to break down the transmitter circuit into: a basic oscillator circuit 2 of which the main elements are surface acoustic wave (SAW) device 10, transistor 11, capacitor 12 and coil 14; a feedback portion 3 of the oscillator circuit 2 of which the principal elements are (SAW) device 10 and coil 14, and; a modulation circuit 4 which is generally composed of the elements in the lower right quadrant of the Figure. However, it should be understood that an r-f transmitter circuit generally oscillates as a whole and thus from another view modulation circuit 4 may be considered to be part of feedback circuit 3 and oscillator circuit 2. Data is input to the transmitter via lines 17 and 18 and the r-f output is provided on antenna 19, which, in the preferred embodiment, is a trace on a printed circuit.

Turning now to a more detailed description of the preferred embodiment of the invention, the elements of the transmitter include surface acoustic wave (SAW) device 10, transistor 11, coils 14, 20 and 21, voltage variable capacitor 22, variable capacitors 23 and 24, capacitors 12 and 25 through 30, resistors 31 through 39, and diode 40. The SAW device 10 is preferably a surface acoustic wave resonator (SAWR) 8 packaged in a protective case 9. One side of the SAWR 8 is connected to coil 14 and the other is connected to the base of transistor 11. The case 9 of thw SAW device 10 is connected to ground. The emitter of transistor 11 is connected to ground through resistor 31 and capacitor 25 which are connected in parallel. The collector of transistor 11 is connected to ground through capacitor 26 and resistor 32 in series, to the other side of coil 14, and to ground through the antenna 19 and capacitor 12. Variable capacitor 24 is connected in parallel with antenna 19. Coil 21 is connected between antenna 19 and the positive power supply voltage (V+). Capacitor 30 is connected between the positive voltage line and ground. The line between the SAWR 8 and the base of transistor 11 is connected to a modulation circuit 4 generally located in the lower right corner of FIG. 1. (Insofar as the rest of the circuitry interacts with the modulation circuitry 4, it also may be considered part of the modulation circuit 4.) One side of coil 20 is connected to the line between SAWR 8 and the base of transistor 11. The other side of the coil 20 is connected to ground through resistor 33 and capacitor 27 in p rallel and through variable capacitor 23; the same side of coil 20 is also connected to the positive voltage line through resistor 39 and to on side of capacitor 29. The other side of capacitor 29 is connected to the positive voltage line through resistor 38, to ground through resistor 37 and diode 40 connected in series with the cathode of the diode toward ground, to ground through voltage variable capacitor 22, and to the data input line 17 through resistors 34 and 35. The line between resistors 34 and 35 is connected to ground through capacitor 28. The line 18 represent the ground side of the data input circuit. Resistor 36 is connected between data input lines 17 and 18.

Figure 2:
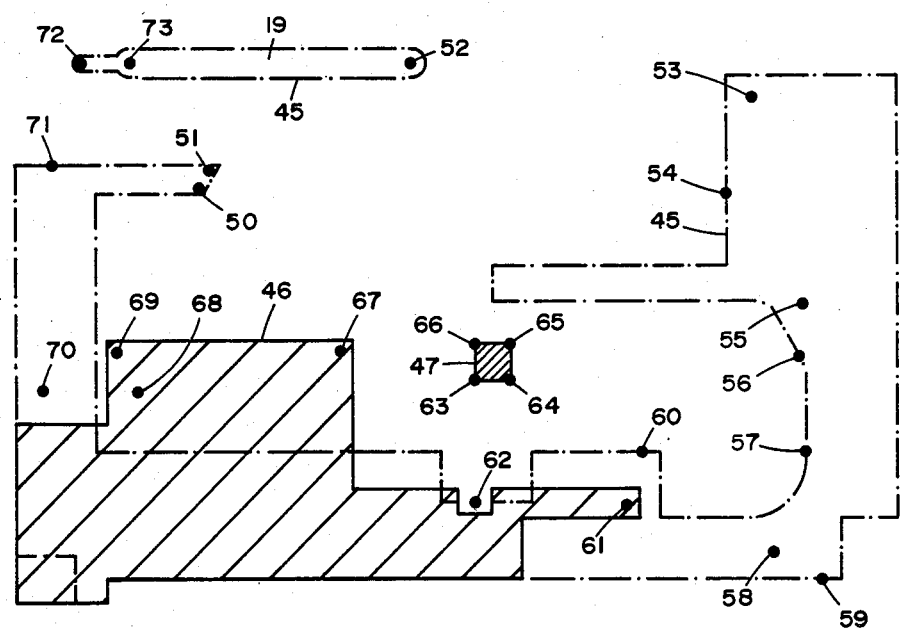
FIG. 2 is a diagram of the principal traces of the printed microcircuit according to the invention showing the connection points of the circuit of FIG. 1.

Turning now to FIG. 2, the microcircuit traces are shown. That is, in the preferred embodiment, the circuit of FIG. 1 is placed on an integrated circuit chip or printed circuit board and the various connections are made via metallic traces printed on the chip. There are two major traces: the ground trace 45 indicated by a broken line and the positive voltage trace 46 indicated by the solid line. Traces 45 and 46 are separated on the IC chip or printed circuit board by an insulating layer. An approximately $\frac{1}{8}"\times 1"$ portion 19 of trace 45 acts as the r-f antenna when a printed circuit board is used. When this circuit is used in a shielded hybridized (miniaturized) circuit, a separate antenna must be used to radiate the energy outside the shield. A third trace 47 used for connecting four circuit elements is also shown. Other conventional traces as generally indicated by the remaining circuit lines of FIG. 1 are also on the chips or printed circuit boards but are not shown. The connections to the three traces shown are indicated by black dots, such as 67, and correspond to the circuit points having the same numbers on the circuit diagram of FIG. 1. The structure of the traces shown is important if the proper oscillation of the circuits to be obtained, although similar traces may be used and tuned to the proper oscillation frequencies as is known in the art.

In the preferred embodiment, SAW device 10 is a UHF 315 megahertz zero degree phase surface acoustic wave resonator, transistor 11 is a bi-polar type 2SC2876, and coil 14 is a 6 turn 0.125 inch diameter, thirteen-thirty-second inch long, air core coil made of #28 A.W.G. wire. Preferably, coil 20 is a 0.47 microHenry fixed coil and coil 21 is a 1.5 microHenry fixed coil. Voltage variable capacitor 22 is preferably a type MV2l05 AFC silicon Epicap diode (available from Motorola, Inc.), and variable capacitors 23 and 24 are 5-35 picofarad capacitors.

Capacitors 25, 28, 30 and 12 are preferably 470 picofarad while 26 is a 1000 pf, 27 is a 94 pf, and 29 is a 47 pf capacitor.

Resistors 34, 35 and 37 are preferably 100K ohm resistors, resistor 31 is a 100 ohm resistor, 32 is a 47K ohm resistor, 36 is a 600 ohm resistor and 38 is a 2 megaohm resistor. Diode 40 is a type 1N4148. The traces such as 19, are preferably of copper.

The circuit functions as follows. SAWR 8, transistor 11, capacitor 12 and coil 14 form a Pierce oscillator circuit with the SAWR 8 dominating the oscillation frequency. The transistor 11 is the active amplification element. The SAWR 8 and coil 14 may be considered to be the principal elements of a feedback circuit 3. The fundamental or "centerline" frequency is preferably tuned by mechanically adjusting the separation of the turns of coil 14. The line including capacitor 26 and resistor 32 shunts the SAWR 8 indirectly with capacitor 26 blocking DC current and resistor 32 serving as a load and a circuit Q regulator (see discussion of Q below). The shunt shortens the startup time of the oscillator circuit 2. Capacitor 30 is a bypass capacitor to prevent r-f energy from entering the modulator portion of the circuitry through ground. Coil 21 has a lower resonant frequency than the rest of the circuit and serves as a choke to prevent the antenna energy from feeding through capacitors 30 and 12 into the biasing circuitry (see below) of the transistor 11. Variable capacitor 24 may be used to tune the antenna resonant frequency. Capacitors 26, 30 and 12 are chosen to be low in capacitive resistance so as not to cause significant thermal stability problems.

The modified Pierce oscillator circuit 2 further includes coil 20 and variable capacitor 23 which, as will be further discussed below, also can be considered part of the modulation circuitry. These two elements tune both the centerline frequency of oscillation and the modulated frequency. Resistors 39 and 33 and coil 20 set the D.C. bias point for transistor 11 to determine the gain for the transistor. Resistor 31 and capacitor 25 further refine the gain adjustment, preventing degeneration of the gain in low battery situations.

The modulation circuit is primarily composed of capacitors 27, 28, 29, resistors 34 through 38, variable capacitor 23 and voltage variable capacitor (VVC) 22, of which the latter is the most important element. Capacitor 27 shunts the VVC and trimmer capacitor 23. Capacitor 27 is selected to be temperature compensating for VVC 22. Capacitor 28 and resistor 35 form a filter network. Resistor 36 provides a consistent low impedance load for the incoming data signal and is sized to match the data input circuit used. The resistors 34 through 38 together form a D.C. voltage divider that helps prevent undesirable negative voltages from occurring at the cathode of VVC 22. Capacitor 29, resistor 37 and diode 40 provide shunt line for both the trimming circuit (23 and 20) and the modulation circuit, with capacitor 29 preventing D.C. current flow, resistor 37 serving as a load to prevent excessive power flow from the circuits shunted, and diode 40 acting as a voltage regulator for the resistance divider network.

The centerline frequency and the deviation frequency (the amount the frequency deviates when modulated) are preferably adjusted by trimming variable capacitor 23. The frequency may also be adjusted by trimming coil 20. The latter trimming is performed by mechanically moving the coil turns slightly in relation to one another. (In a hybrid version of the transmitter which I have built, the mechanical trimming of the coil 20 is the preferred method of adjusting the frequencies.) Coils 14 and 20 may be changed to allow for different centerline and deviation frequencies than those discussed herein. These coils play an important role in maintaining the feedback energy in a positive rather than negative phase, thus sustaining the oscillations. These coils are unique in that their Q is quite low compared to the conventional Q values that would be provided in a circuit of this type. The low Q of these coils is an important factor in obtaining the low total Q of the feedback circuit (see below).

The operation of the circuit is as follows. The oscillation of the basic r-f oscillator circuit 2 is stabilized by the feedback portion 3 of the circuit which includes SAW device 10. (The oscillation frequency may be tuned by trimming coil 20 in some embodiments.) The oscillation of the feedback circuit, and thus the oscillation of the whole circuit, is modulated by the data input in the following manner. Voltage variable capacitor 22 responds to a change in the data input voltage to change the capacitance of the modulation circuit. The changed capacitance of the modulation circuit causes its oscillation frequency to shift. The modulation circuit parallels the SAWR circuit and a change of its resonance frequency therefor causes the effective resonance of the entire circuit to change. The modulating circuit may be thought of as "pulling" the normal SAW resonance frequency to the modulated frequency. In the circuit shown, a data input voltage change of about 5 volts causes a change in oscillation frequency of about 60 to 90 kilohertz, depending on the tuning. Changes of 100 kilohertz and above have been obtained. Preferably, both the overall SAWR centerline frequency and the modulation frequency (frequency deviation) may be tuned simultaneously using the variable capacitor 23 (or coil 20).

The transmitter of the present invention preferably utilizes frequency shift keying (FSK), though other frequency modulation may be used. The input signal is preferably a digital signal comprising a series of voltage transitions between a high voltage value (preferably 4 to 5 volts) and a low voltage value (preferably 0.1 to 0.4 volts). The signals are preferably Manchester encoded, which permits the synchronization with the receiver associated with the transmitter to be updated regularly. Preferably, the digital input signal has a voltage level of from about zero to 5 volts at about 4 kilohertz. Other digital encoding systems may be used, however.

Figure 3:
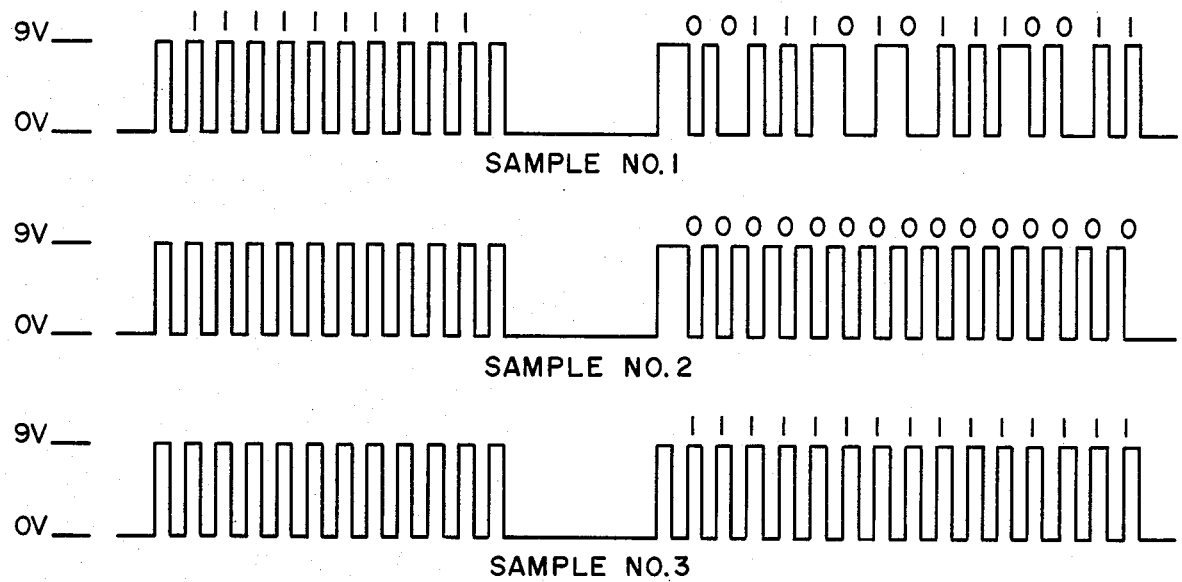
FIG. 3 shows three samples of the preferred data signal that may be applied to the transmitter.

FIG. 3 shows three samples of Manchester encoded signals. Each of the three samples contains a preamble portion (at the left in each sample) that is a series of Manchester encoded 1's. This preamble allows the transmitter time to warm up and the receiver time to establish communication. (If a few data bits at the front end are lost, it creates no problem.) Each sample also includes a central portion of zero voltage (not Manchester encoded) which provides a transition to the significant data bits which follow. Note that even where the signal is all 0's or all 1's (as in the right hand portion of samples Nos. 2 and 3 respectively) the Manchester system makes regular transitions between the low and high voltage values. This is the feature that permits the regular synchronization with the receiver.

The voltage transitions of the digital signal (Manchester or otherwise) will, as described above, cause a corresponding frequency shift of the transmitted r-f signal of the order of 60-90 kilohertz. The frequency shift is utilized by a receiver (see below) to recreate the digital voltage signal.

Figure 4:
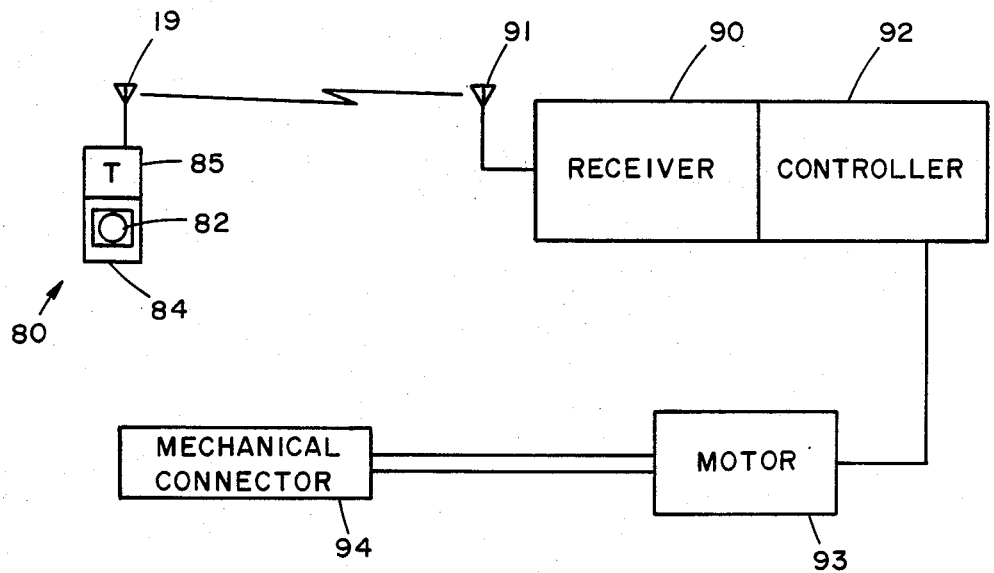
FIG. 4 is a diagrammatic illustration of a garage door opener employing the transmitter according to the invention.

FIG. 4 shows a garage door opener system employing the transmitter of FIGS. 1 and 2. The system includes a sending unit 80, a receiver 90, a controller 92, a motor 93 and a mechanical connector 94 which attaches to the garage door to be opened.

The sending unit includes a manually operable switch 82, a signal processing unit 84 and a transmitter 85 a described in reference to FIGS. 1 and 2. The switch 82 provides a signal to the signal processing unit 84. The signal processing unit provides a data signal to the inputs 17 and 18 (FIG. 1) of the transmitter 85. The signal is preferably a Manchester encoded digital signal as described in reference to FIG. 3. The transmitter transmits a signal on antenna 19 which signal is preferably frequency shift keyed to the voltage transitions of the Manchester coded data signal. The r-f signal is received by receiver 90 via antenna 91 and the receiver provides a data signal to a controller 92 which decodes the signal and provides output power to motor 93. The motor drives a mechanical connector 94 connected to a garage door (not shown) to open or close the door as determined by the controller 92. Feedback signals from connector 94 and motor 93 are provided to controller 92 which thereupon turns off the power and resets for the next operation. The controller als may stop the opening or closing action upon reception of a signal from transmitter 85. The switch 82, signal processing circuitry 84, receiver 90 and its antenna 91, controller 92, motor 93 and mechanical connector 94 may be an appropriate conventional parts and will not be discussed further herein. The garage door opener system according to the invention is highly reliable due to the relatively strong, stable signal provided by SAW transmitter 85, the fact that the signal has a frequency and modulation mode that is relatively free of interference and spurious signals, the fact that the transmitter is much more resistant to shock than prior art systems, and the relatively low power consumption that preserves batteries.

It is evident that numerous other applications of the transmitter according to the invention are possible.

The SAW stabilized transmitter according to the invention does not have the temperature shifts and drift problems associated with conventional LC and RC type oscillator/transmitter devices, and does not have the power supply and battery failure problems associated with the prior art bulk crystal oscillator circuits. The SAW oscillator/transmitter does not exhibit the spurious modes of oscillation that marred prior art transmitters. In addition, the power levels of the harmonic oscillation frequencies are greatly attenuated from the fundamental frequency as compared to prior art oscillators/transmitters.

A feature of the invention is the on-board antenna and output antenna load simulation which result in high oscillator startup reliability, which is useful in a transmitter that must start up many times from a de-energized condition. Further, the operating voltage range of the transmitter is very broad, ranging from 3V to 12V DC with only a slight frequency change.

The invention is the first garage door opener having a workable FM SAW oscillator/transmitter. An important factor in producing the workable FM SAW oscillator/transmittrer is the reduction of the Quality ratios (Q) of the feedback circuit in comparison to conventional circuits. Q may be defined either in terms of bandwidths, which Q we shall refer to herein as $Q_{bw}$, or in terms of impedance (Z) and resistance (R) which we shall refer to herein as $Q_{ZR}$. It is noted that Q is a relative term and that the two Q values are not equal in general. $Q_{bw}$ may be defined as $Q_{bw}=F_o/\Delta F$ where Fo is the fundamental frequency (318 megahertz in the preferred embodiment) which is given by the equation $F_o=\frac{1}{2}\pi\sqrt{LC}$, where L is the inductance and C is the capacitance, and $\Delta F$ is the frequency change in modulation (60–100 kilohertz generally in the preferred embodiment). $Q_{ZR}$ may be defined as $Q_{ZR}=Z/R$ with Z given by $Z=(Xl-Xc)$, where Xl is the inductive reactance and Xc is the capacitive reactance, and R is the DC and skin effect resistance. Conventional transmitter design strives to maintain high Q feedback circuits. It was believed that $Q_{bw}$ should be about $16\times10^3$ in feedback circuits in order to obtain suitably high output power to have an acceptable transmitter broadcast range. (The broadcast range should be at least 100 feet for garage door opener transmitters.) However, SAWR based oscillation circuits of hi $Q_{bw}$ tend to flip into free running modes. It is a feature of the invention that the $Q_{bw}$ of the feedback circuit is unusually low, typically below $12\times10^3$. Preferably, $Q_{bw}$ is about $3\times10^3$. It is also a feature of the invention that the coils 14, 20 are made of a wire that is much smaller in diameter than typically used in oscillator circuits of this type. Reduction of the wire diameter is important in establishing the low $Q_{ZR}$ required for frequency pullability suitable for FSK. The reduction of the wire diameter increases the resistance by limiting current and reducing the electrical cross section thus increasing the r-f skin effect. In the SAWR circuit, the reactances, Xc and Xl, generally must remain constant for a constant frequency so that resistance becomes the significant variable. With the proper biasing of transistor 11, as discussed above, broadcast ranges of up to 900 feet have been obtained, despite the low Q values. This broadcast range is optimum for many applications. The FM SAW transmitter of the present invention is particularly useful because it is not susceptible to the noise and interference problems that disrupt AM SAW transmissions.

Another feature of the invention is that it is manufactured on a single IC chip. Prior to the present invention, it was not thought possible to place such a transmitter on a chip. The design of the traces given above is important for this.

Still another feature of the invention is the unusually fast startup time of the SAW transmitter. Such fast startup results in less loss of data and shorter transmission times.

An important feature of the invention is the relatively large shifts of frequency obtained. As indicated above, frequency shifts of 60–90 kilohertz are routine and shifts of 100 kilohertz have been obtained. Prior to the present invention, it was thought that such high frequency shifts would cause the SAW device to go into free running mode and not return to the fundamental frequency.

Still another feature of the invention is the use of a variable voltage capacitor or tuning diode to modulate the SAWR circuit. It is possible with the design shown to modulate down to zero volts. This was never done on an FM transmitter IC chip prior to the present invention.

A novel FM SAW transmitter and a garage door opener system employing the transmitter have been described. It is evident that those skilled in the art may now make many uses and modifications of the specific embodiments described, without departing from the inventive concepts. Many other equivalent electronic elements and materials may be used. For example, different amplifiers may be substituted for transistor 11, other inductance combinations may be employed, different trace designs and materials may be substituted, the circuit may be made other than on a chip, and so on. Many variations of sending units and receivers may be used. Many types of frequency modulation may be used and many kinds of encoding systems, digital or otherwise, may be used. Other SAW devices may be used: for example, I have successfully used an 180 degree phase SAW oscillator in a similar FM transmitter circuit. Many types of garage opener electronics and mechanical parts may be employed. Consequently, the invention is to be construed as embracing each and every novel combination of features present in the transmitter and garage door opener described.

What is claimed is:

1. A garage door opener system comprising:
   a means for mechanically connecting to a garage door;
   a motor for driving said means for connecting;
   a manually operable switch;
   means responsive to said switch for producing a transmitter input signal,
   a transmitter responsive to said transmitter input signal for producing an r-f outout signal, said transmitter comprising an electric oscillator circuit means for producing said r-f output signal, a surface acoustic wave device connected within said oscillator circuit means for stabilizing oscillations of said r-f output signal, and means for modulating the oscillation frequency of said oscillator circuit means;
   a receiver for receiving said r-f output signal and for producing a controller input signal;
   a controller means responsive to said controller input signal for providing power to said motor.

2. The garage door opener of claim 1 wherein said oscillator circuit means includes a feedback circuit and said surface acoustic wave device is a surface acoustic wave resonator electrically connected within said feedback circuit to stabilize the oscillation of said oscillator circuit means about prescribed frequency.

3. The garage door opener of claim 2 wherein the Q of said feedback circuit is less than 12,000.

4. The garage door opener of claim 1 wherein said means for modulating comprises a means for modulating the capacitance of said oscillator circuit means.

5. The garage door opener of claim 4 wherein said means for modulating the capacitance comprises a voltage variable capacitor.

6. The garage door opener of claim 1 and further including input means for producing an input signal having a series of voltage transitions between a high voltage value and a low voltage value, and wherein said means for modulating modulates the oscillation frequency of said oscillator circuit means to produce an r-f signal having frequency shifts corresponding to said voltage transitions.

7. The garage door opener of claim 6 wherein said input signal comprises a Manchester encoded signal.

8. The garage door opener of claim 6 wherein said oscillation frequency is in a range between 50 megahertz and one gigahertz.

9. The garage door opener circuit of claim 8 wherein said frequency shift is equal to or greater than 60 kilohertz.

* * * * *